United States Patent
Till

(10) Patent No.: US 9,170,013 B2
(45) Date of Patent: *Oct. 27, 2015

(54) AIR DEFLECTORS FOR HEAT MANAGEMENT IN A LIGHTING MODULE

(71) Applicant: Phoseon Technology, Inc., Hillsboro, OR (US)

(72) Inventor: Gary Till, Portland, OR (US)

(73) Assignee: Phoseon Technology, Inc., Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/528,441

(22) Filed: Oct. 30, 2014

(65) Prior Publication Data

US 2015/0053873 A1 Feb. 26, 2015

Related U.S. Application Data

(63) Continuation of application No. 13/408,973, filed on Feb. 29, 2012, now Pat. No. 8,888,336.

(51) Int. Cl.
*F21V 29/00* (2015.01)
*H05K 7/20* (2006.01)
(Continued)

(52) U.S. Cl.
CPC ........... *F21V 29/2293* (2013.01); *B01J 19/123* (2013.01); *F21V 19/002* (2013.01); *H05K 7/20145* (2013.01); *F21Y 2105/001* (2013.01); *Y10T 29/49826* (2015.01)

(58) Field of Classification Search
CPC .. F21V 29/2293; F21V 19/002; B01J 19/123; F21Y 2105/001; H05K 7/20145
USPC .................. 362/249.02, 373, 294; 250/504 R
See application file for complete search history.

(56) References Cited

U.S. PATENT DOCUMENTS

| 5,857,767 A | 1/1999 | Hochstein |
| 5,936,353 A | 8/1999 | Triner et al. |

(Continued)

FOREIGN PATENT DOCUMENTS

| DE | 19619154 A1 | 6/1997 |
| DE | 10127171 A1 | 12/2001 |

(Continued)

OTHER PUBLICATIONS

Data Sheet for G*SiC Technology Super Blue LEDs No. C430-CB290-E1200, manufactured by Opto Semiconductors, May 1, 1999, 8 pages.

(Continued)

*Primary Examiner* — Anabel Ton
(74) *Attorney, Agent, or Firm* — Alleman Hall McCoy Russell & Tuttle LLP

(57) ABSTRACT

A lighting module has an array of light-emitting elements that is electrically coupled to a heat sink and a housing having a heat exit. The array of light-emitting elements is positioned in the housing and the heat sink is positioned to dissipate heat generated within the housing so that the heat is expelled through the heat exit. A deflector is secured to the housing and is positioned to extend over some portion of the heat exit. The deflector guides heat away from the housing in a direction. In some configurations, the deflector guides heat away from the housing in a direction that is opposite the direction in which the array of light-emitting elements emit light. Also, some lighting modules have multiple heat exits and may have multiple deflectors extending over a portion of the respective heat exits.

18 Claims, 2 Drawing Sheets

(51) Int. Cl.
*B01J 19/12* (2006.01)
*F21V 19/00* (2006.01)
*F21Y 105/00* (2006.01)

(56) References Cited

U.S. PATENT DOCUMENTS

| | | | |
|---|---|---|---|
| 6,200,134 | B1 | 3/2001 | Kovac et al. |
| 6,457,823 | B1 | 10/2002 | Cleary et al. |
| 6,501,084 | B1 | 12/2002 | Sakai et al. |
| 6,683,421 | B1 | 1/2004 | Kennedy et al. |
| 6,692,250 | B1 | 2/2004 | Decaudin et al. |
| 7,988,336 | B1 | 8/2011 | Harbers et al. |
| 8,596,836 | B2 | 12/2013 | Pedersen et al. |
| 8,632,210 | B2 | 1/2014 | Hochstein |
| 8,888,336 | B2 * | 11/2014 | Till .............................. 362/373 |
| 2001/0046652 | A1 | 11/2001 | Ostler et al. |
| 2002/0187454 | A1 | 12/2002 | Melikechi et al. |
| 2003/0043582 | A1 | 3/2003 | Chan et al. |
| 2003/0081096 | A1 | 5/2003 | Young |
| 2004/0004817 | A1 | 1/2004 | Greco |
| 2008/0080196 | A1 * | 4/2008 | Ruud et al. .................... 362/373 |
| 2009/0251898 | A1 | 10/2009 | Kinnune et al. |
| 2013/0107531 | A1 | 5/2013 | Breidenassel et al. |
| 2015/0053873 | A1 * | 2/2015 | Till .......................... 250/504 R |

FOREIGN PATENT DOCUMENTS

| | | |
|---|---|---|
| EP | 0879582 A2 | 11/1998 |
| EP | 1158761 A1 | 11/2001 |
| JP | H07147110 A | 6/1995 |
| JP | 2010056045 A | 3/2010 |
| WO | 9507731 A | 3/1995 |
| WO | 0059671 A1 | 10/2000 |
| WO | 0067048 A2 | 11/2000 |
| WO | 0211640 A2 | 2/2002 |
| WO | 0213231 A2 | 2/2002 |
| WO | 03023875 A2 | 3/2003 |
| WO | 2004078477 A1 | 9/2004 |
| WO | 2008156983 A1 | 12/2008 |
| WO | 2010144154 A1 | 12/2010 |

OTHER PUBLICATIONS

Data Sheet for 5.0 mm Blue Series LEDs No. LNG992CFB, manufactured by the Panasonic Corporation, Mar. 2001, 1 page.
Data Sheet for 3.0 mm Blue Series LEDs No. LNG997CKB, manufactured by the Panasonic Corporation, Mar. 2001, 1 page.
Data Sheet for G*SiC Technology Ultraviolet LEDs No. CXXX-MB290-E400, manufactured by Cree, Inc., Available as Early as Jul. 2001, 2 pages.
ISA Korean Intellectual Property Office, International Search Report and Written Opinion Issued in Application No. PCT/US2013/028393, Jun. 26, 2013, WIPO, 9 pages.

* cited by examiner

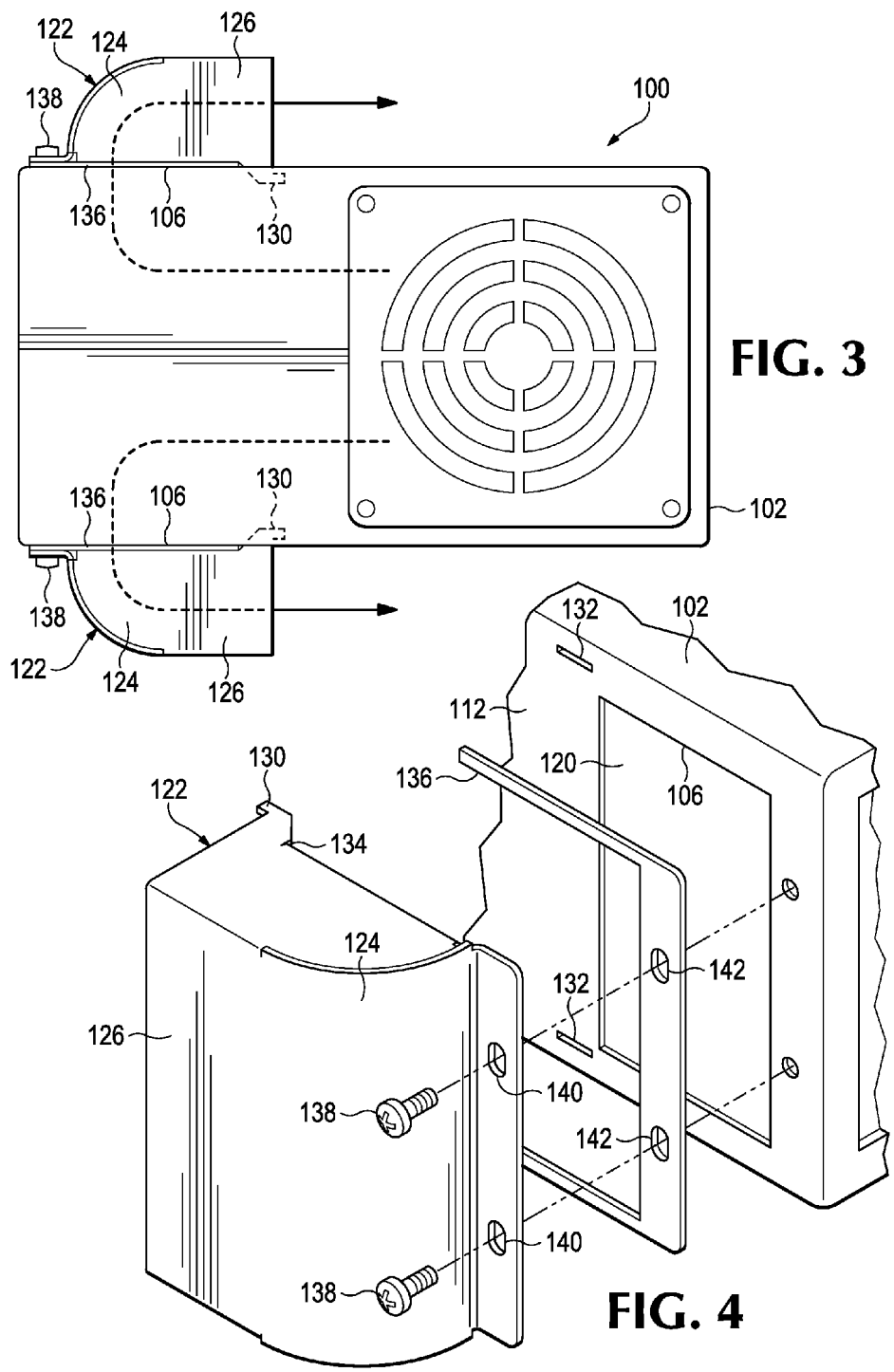

AIR DEFLECTORS FOR HEAT MANAGEMENT IN A LIGHTING MODULE

CROSS REFERENCE TO RELATED APPLICATIONS

The present application is a continuation of U.S. patent application Ser. No. 13/408,973, entitled "AIR DEFLECTORS FOR HEAT MANAGEMENT IN A LIGHTING MODULE," and filed on Feb. 29, 2012, the entire contents of which are hereby incorporated by reference for all purposes.

BACKGROUND

Solid-state light emitters, such as light emitting diodes (LEDs) and laser diodes, have several advantages over using more traditional arc lamps during curing processes, such as ultraviolet (UV) curing processes. Solid-state light emitters generally use less power, generate less heat, produce a higher quality cure, and have higher reliability than traditional arc lamps. Some modifications increase the effectiveness and efficiency of the solid-state light emitters even further.

While solid-state light emitters emit less heat than their arc lamp counterparts, the temperatures emitted from the solid-state light emitters are still very high and can cause overheating of the solid-state light emitters during use and damage to the components of the solid-state light emitters over time. Overheating and damage to the components of the solid-state light emitters causes significant amounts of downtime for repair and loss of revenue.

Some solid-state light emitters try to incorporate cooling systems to remove some of the heat that is generated when the solid-state light emitter emits light. Oftentimes, these cooling systems include one or more heat sinks that help remove heat generated by the solid-state light emitters from the housing through openings or other heat exits in the housing, which results in air being expelled from the housing. These openings or heat exits in the housing are generally located near the medium on which the curing process occurs and can cause air to be expelled onto the medium, which disturbs or damages the curing process and decreases its accuracy. This results in the curing process needing to be repeated, which increases manufacturing costs and decreases quality and efficiency.

BRIEF DESCRIPTION OF THE DRAWINGS

FIG. 3 shows a top plan view of the air flow pathway that exits the lighting module having the deflectors that is illustrated in FIG. 1.

FIG. 4 shows a partial exploded view of a deflector and the portion of the lighting module to which it is secured.

DETAILED DESCRIPTION OF THE EMBODIMENTS

Figure 1:
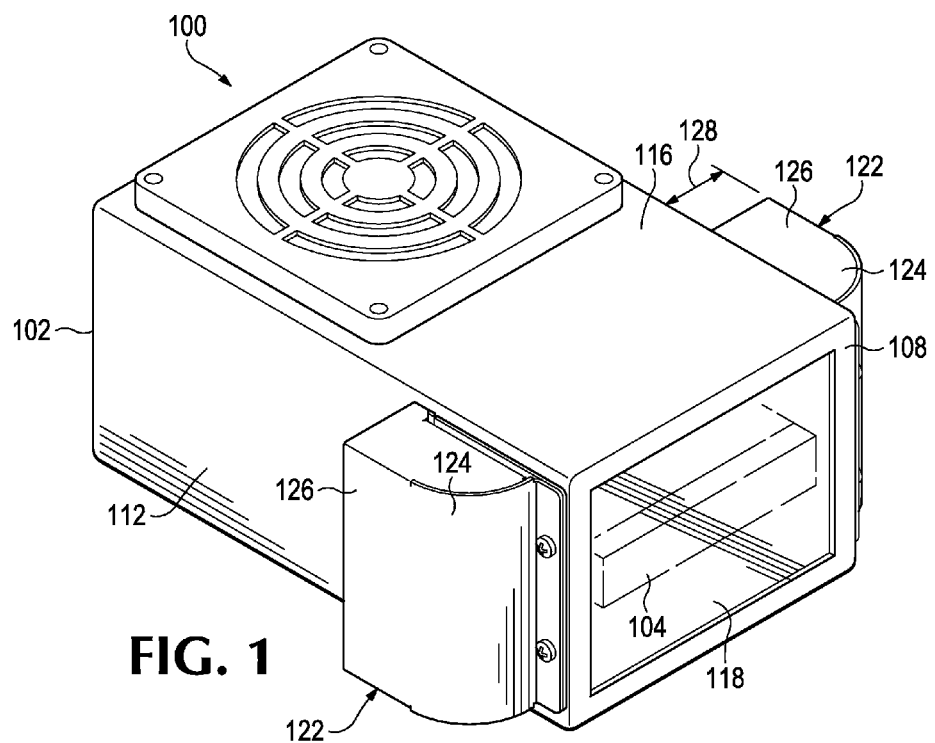
FIG. 1 shows a front perspective view of a lighting module having deflectors.
Figure 2:
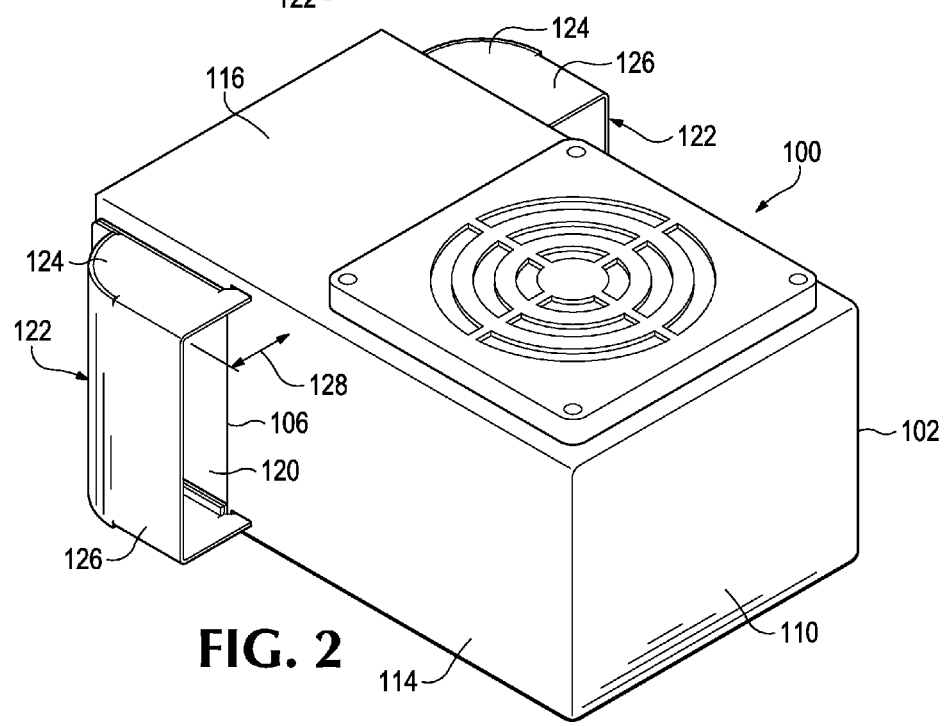
FIG. 2 shows a back perspective view of the lighting module with the deflectors shown in FIG. 1.

FIGS. 1 and 2 show a lighting module 100 having a housing 102, an array of light-emitting elements 104, and a pair of heat exits 106. The housing 102 is a rectangular, box-shaped structure in this example, although it can be any other suitable size and shape in other configurations. The housing 102 is a protective structure to house the array of light-emitting elements 104 and may include any suitable protective materials. The housing 102 in FIGS. 1 and 2 has a front surface 108, a back surface 110, two opposing side surfaces 112, 114, a top surface 116, and a bottom surface (not shown). The front surface 108 includes a window 118 through which the array of light-emitting elements 104 emits light. The window 118 may be positioned on another suitable surface of the housing 102 in other configurations.

The window 118 of the lighting module 100 is positioned such that the array of light-emitting elements 104 emit light toward a medium with some type of light-curable material. For example, the lighting module 100 is positioned vertically and a substrate, such as paper or plastic, is positioned below the lighting module 100, such that the front surface 108 of the lighting module 100 having the window 118 through which the light is emitted faces the substrate. The light-curable material is positioned on the substrate so that the light cures the material when light is emitted through the window 118. The lighting module 100 is movable with respect to the medium in some configurations and may be adjustable in any suitable direction to achieve the necessary cure of the light-curing material to the medium. The array of light-emitting elements 104 may include light-emitting diodes (LEDs). These LEDs may emit light in a range of wavelengths. For example, the LEDs may emit ultraviolet light in the range of wavelengths between 10-400 nanometers.

During the curing process, the array of light-emitting elements 104 generates a substantial amount of heat when it emits light that can damage the lighting module 100. Various heat management systems have been developed to help control the heat generated during this process, such as including one or more heat sinks 120 in the lighting module 100. The heat sink(s) 120 included in the lighting module 100 are often positioned to dissipate the heat generated within the housing 102 so that the heat can be expelled through a heat exit 106 or other type of opening in the housing 102 of the lighting module 100. In some examples, the heat dissipated by the heat sink(s) is expelled through the heat exits by a fan or other expulsion device. In other configurations, the heat is expelled through the heat exits in a passive manner without the use of a fan or any other type of expulsion device. Reference to the expulsion of heat from the housing 102 of the lighting module 100 includes both the active expulsion of the heat by an expulsion device, such as a fan, and the passive expulsion of heat that does not require any type of assistive device to cause the heat to exit the housing 102. Example heat exits 106 and an example heat sink 120 are shown in FIGS. 1 and 2.

The heat sink(s) 120 dissipate warm or hot air generated within the housing 102 that then exits the housing 102 through the heat exits 106 or openings positioned on the opposing side surfaces 112, 114 of the housing 102, as shown in FIGS. 1 and 2. In some examples, the heat sink(s) 120 are spaced apart from or otherwise considered a discrete element from the heat exits 106. In other examples, the heat sinks 120 are integrally formed with the heat exits 106. FIGS. 1 and 2 show a portion of a heat sink that is positioned within the openings of the heat exits 106. In this configuration, warm or hot air is expelled through the heat exits 106. Without the deflectors 122 shown in FIGS. 1 and 2, this air is expelled in various directions from the housing 102, including toward the front surface 108 and the window 118 of the housing 102 and thus toward the medium where the curing occurs. When air is allowed to be expelled in the direction of the medium where the curing occurs, it often disrupts the curing process. The deflectors 122 shown in FIGS. 1 and 2 guide the heat that generates the warm or hot air away from the housing 102 in a direction away from the medium upon which the curing occurs. In these examples, the deflectors 122 guide the heat away from the housing 102 in a direction away from the window 118 through which the light is emitted because the medium is positioned adjacent or otherwise near the window 118.

The deflectors 122 in FIGS. 1 and 2 guide the air away from the housing 102 of the lighting module 100 in a direction that is approximately 180° away from the window 118, essentially in a direction exactly opposite of the window 118, as shown by the arrows in FIG. 3. This configuration causes the least amount of air to disrupt the curing process because the air flow path directs the air in the opposite direction of the window 118 on the front surface 108 of the lighting module 100 and thus away from the medium upon which the curing process occurs. However, alternative examples the deflectors 122 guide the air in a direction that is at an angle that is at least 90° with respect to the window 118 and in other examples the deflectors guide the air in a direction that is at an angle that is at least 120° with respect to the window 118.

The deflectors 122 are any suitable shape that guides the heat away from the housing 102 of the lighting module 100. The deflectors 122 in FIGS. 1-4 have a curved portion 124 at one end that extends over a portion of the heat exit 106. In other configurations, the curved portion 124 extends over the entire heat exit 106 or accounts for the entire deflector 122. For example, the contour of the deflector 122 may be entirely curved (i.e., the curved portion may comprise the entire deflector), may have multiple different curved portions, or may be some combination of curved and linear portions. Again referring to FIGS. 1-3, the deflectors 122 have a curved portion 124 and a linear portion 126. The curved portion 124 and a portion of the linear portion 126 extend over the heat exit 106 in these examples. The linear portion 126 extends beyond the heat exit 106 on the side surface 112 of the lighting module 100. The deflector 122 extends a distance 128 away from the side surface 112 of the lighting module 100 to permit heat and air to be guided away from the housing 102. The radius of curvature of the curved portion 124 affects the angle at which the air or heat is guided away from the housing 102 of the lighting module 100. As the radius of curvature of the curved portion 124 decreases the angle at which the heat or air is guided away from the housing 102 of the lighting module 100 increases with respect to the window 118 and the medium.

In FIGS. 1-3, the lighting module 100 includes two heat exits 106 and two corresponding deflectors 122 that extend over their respective heat exits 106. In this example, a deflector 122 is positioned to extend over every heat exit 106. However, in alternative configurations, some heat exits do not have a corresponding deflector. The heat exits are positioned anywhere on the housing of the lighting module in any suitable arrangement and on any surface of the housing. The heat exits are arranged to most effectively help the heat sinks expel the heat and air from the housing when the array of light-emitting elements generate heat during use. In some examples, one heat sink 120 is positioned within the housing 102 to dissipate heat generated within the housing 102, which is then expelled during use of the light-emitting elements 104. The housing 102 may have two heat exits 106 positioned on either side surface 112, 114 of the housing 102 to expel heat from the heat sink 120, as shown in FIGS. 1-3. In some examples, the heat exits 106 are a discrete element from the heat sink 120 and in other examples, the heat exit(s) 106 form a portion of the heat sink 120. In other examples, multiple heat sinks are positioned in the housing and expel heat or air through one or more heat exits in any suitable manner. One or more deflectors may be positioned over anyone or more heat exits in these examples.

FIG. 4 shows a partial exploded view of a deflector 122 and the portion of the lighting module 100 to which it is secured. The deflector 122 is secured to the housing 102 with two different securing mechanisms in this example, although any suitable number and type(s) of securing mechanisms may be used in alternative configurations. The securing mechanism (s) may permanently attach the deflector to the housing of the lighting module, such as via cements, bonding, adhesives, and the like or the deflector may be removable from the housing such as with detachable mechanical connectors. The first securing mechanism includes two tabs 130 secured to or otherwise formed integrally with the deflector 122 and a complementary set of slots 132 into which the tabs 130 are fitted. The tabs 130 are located near the opening of the deflector 122 and on the surface of the deflector 122 that physically contacts the housing 102 when the deflector 122 is secured to the housing 102. The tabs 130 define a notch 134 into which an edge of a spacer 136 fits. The spacer 136 is positioned between the deflector 122 and the housing 102 and extends around a portion of the perimeter of the heat exit 106. Some spacers function as a type of gasket or sealer and may include various heat and/or moisture resistant materials. When the spacer functions as a type of gasket or sealer, it helps to prevent air that exits the lighting module 100 from escaping at the seam between the deflector 122 and the housing 102 and helps guide the air through the deflector 122 and away from the lighting module 100 in the intended direction. The second securing mechanism is a set of two screws 138 that extend through screw holes 140 in the deflector 122, screw holes 142 in the spacer 136, and into the housing 102. Other configurations include any other suitable securing mechanism.

It will be appreciated that variations of the above-disclosed lighting modules and other features and functions, or alternatives thereof, may be desirably combined into many other different systems, methods, or applications. For example, methods of guiding air or heat away from a lighting module may use anyone or more of the above disclosed deflectors. Also various presently unforeseen or unanticipated alternatives, modifications, variations, or improvements therein may be subsequently made by those skilled in the art which also are intended to be encompassed by the following claims. Thus, although there has been described to this point a particular embodiment for a method and apparatus for lighting modules with deflectors, it is not intended that such specific references be considered as limitations upon the scope of this invention except in-so-far as set forth in the following claims.

What is claimed is:

1. A lighting module, comprising:
    an array of light-emitting elements;
    a heat sink, wherein at least a portion of the array of light-emitting elements is electrically coupled to the heat sink;
    a housing having a first heat exit, wherein the array of light-emitting elements is positioned in the housing, and wherein the heat sink is positioned to dissipate heat generated within the housing so that the heat is expelled through the first heat exit, the housing being a rectangular, box-shaped structure; and
    a first deflector secured to the housing and positioned to extend over at least a portion of the first heat exit, wherein the first deflector has a curved portion and an opening for guiding the heat away from the housing in at least one direction and is removable from the housing.

2. The lighting module of claim 1, wherein the array of light-emitting elements includes light-emitting diodes.

3. The lighting module of claim 2, wherein the light-emitting diodes emit ultraviolet light.

4. The lighting module of claim 1, wherein the housing further has a second heat exit positioned to dissipate heat generated within the housing so that at least a portion of the heat is expelled through the second heat exit, and wherein the second heat exit is spaced apart from the first heat exit.

5. The lighting module of claim 4, further comprising a second deflector positioned to extend over at least a portion of the second heat exit, wherein the second deflector guides heat away from the housing in at least one direction.

6. The lighting module of claim 1, wherein the housing includes a window through which the array of light-emitting elements emits light, and wherein the first deflector guides heat away from the housing in a direction away from the window.

7. The lighting module of claim 6, wherein the first deflector guides heat away from the housing at an angle of at least 90° with respect to the window.

8. The lighting module of claim 6, wherein the first deflector guides heat away from the housing at an angle of at least 120° with respect to the window.

9. The lighting module of claim 1, wherein at least a portion of the heat generated within the housing is generated by the array of light-emitting elements.

10. The lighting module of claim 1, wherein the angle at which the heat is guided away from the housing is at least partially dependent upon the shape of the curved portion.

11. A lighting module, comprising:
a housing defining a first side wall, a second, opposing side wall, and a first interconnecting wall connecting the first side wall and the second side wall, and further defining a first opening in the first side wall, the housing being a rectangular, box-shaped structure;
an array of light-emitting elements positioned in the housing;
a heat sink, wherein the array of light-emitting elements is electrically coupled to the heat sink, and wherein at least a portion of the heat sink is secured within the first opening of the first side wall of the housing; and
a first deflector positioned to extend over at least a portion of the first opening such that the first deflector guides heat dissipated from the heat sink away from the housing in at least one direction.

12. The lighting module of claim 11, wherein the lighting module further includes a window secured to the first interconnecting wall and through which the array of light-emitting elements emits light.

13. The lighting module of claim 12, wherein the first deflector guides heat away from the housing in a direction away from the window.

14. The lighting module of claim 13, wherein the direction away from the window is at least an angle of 90° with respect to the window.

15. The lighting module of claim 13, wherein the direction away from the window is at least an angle of 120° with respect to the window.

16. The lighting module of claim 11, wherein the second side wall further defines a second opening, wherein at least a portion of the heat sink is secured within the second opening.

17. The lighting module of claim 16, further comprising a second deflector positioned to extend over at least a portion of the second opening, wherein the second deflector guides heat away from the housing in at least one direction.

18. A lighting module, comprising:
an array of light-emitting elements;
a heat sink, wherein at least a portion of the array of light-emitting elements is electrically coupled to the heat sink;
a housing having a first heat exit, wherein the array of light-emitting elements is positioned in the housing, and wherein the heat sink is positioned to dissipate heat generated within the housing so that the heat is expelled through the first heat exit, the housing being a rectangular, box-shaped structure;
a first deflector secured to the housing and positioned to extend over at least a portion of the first heat exit, wherein the first deflector guides the heat away from the housing in at least one direction and is removable from the housing, the first deflector being a combination of curved and linear portions; and
a second deflector positioned to extend over at least a portion of a second heat exit oppositely positioned from the first deflector on an opposite wall of the box-shaped structure, wherein the second deflector guides heat away from the housing in at least one direction.

* * * * *